(12) United States Patent
Cole et al.

(10) Patent No.: US 7,154,136 B2
(45) Date of Patent: Dec. 26, 2006

(54) ISOLATION STRUCTURES FOR PREVENTING PHOTONS AND CARRIERS FROM REACHING ACTIVE AREAS AND METHODS OF FORMATION

(75) Inventors: Bryan G. Cole, Meridian, ID (US); Troy Sorensen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 126 days.

(21) Appl. No.: 10/781,707

(22) Filed: Feb. 20, 2004

(65) Prior Publication Data

US 2005/0184291 A1 Aug. 25, 2005

(51) Int. Cl.
*H01L 31/062* (2006.01)
*H01L 31/113* (2006.01)
*H01L 31/112* (2006.01)
*H01L 31/153* (2006.01)
*H01L 31/111* (2006.01)

(52) U.S. Cl. .......................... 257/292; 257/69; 257/83; 257/84; 257/88; 257/93; 257/117; 257/118; 257/187; 257/204; 257/222; 257/290; 257/291; 257/293; 257/294; 257/446; 257/462

(58) Field of Classification Search .................. 257/69, 257/84, 88, 93, 204, 222, 291–293, 446, 257/462, 83, 187, 117–118, 290, 294
See application file for complete search history.

(56) References Cited

U.S. PATENT DOCUMENTS

| | | | | |
|---|---|---|---|---|
| 4,416,050 A | * | 11/1983 | Sarace | 438/226 |
| 4,760,273 A | * | 7/1988 | Kimata | 250/208.1 |
| 5,317,432 A | * | 5/1994 | Ino | 349/39 |
| 5,501,990 A | * | 3/1996 | Holm et al. | 438/34 |
| 5,535,231 A | * | 7/1996 | Lee et al. | 372/50.21 |
| 5,721,429 A | * | 2/1998 | Radford et al. | 250/338.4 |
| 5,838,174 A | * | 11/1998 | Nakagawa et al. | 257/83 |
| 6,118,142 A | * | 9/2000 | Chen et al. | 257/232 |
| 6,177,333 B1 | | 1/2001 | Rhodes | |
| 6,204,524 B1 | | 3/2001 | Rhodes | |
| 6,225,171 B1 | * | 5/2001 | Yu et al. | 438/296 |
| 6,372,603 B1 | * | 4/2002 | Yaung et al. | 438/424 |
| 6,380,037 B1 | * | 4/2002 | Osanai | 438/294 |
| 6,545,302 B1 | * | 4/2003 | Han | 257/222 |
| 6,580,095 B1 | * | 6/2003 | Tani et al. | 257/79 |
| 6,707,075 B1 | * | 3/2004 | Rogers et al. | 257/117 |

(Continued)

FOREIGN PATENT DOCUMENTS

JP 63009968 A * 1/1988

OTHER PUBLICATIONS

Mendis, et al., "CMOS Active Pixel Image Sensor", IEEE Transactions on Electron Devices, vol. 41, No. 3, Mar. 1994, pp. 452-453.

(Continued)

*Primary Examiner*—Ida M. Soward
(74) *Attorney, Agent, or Firm*—Dickstein Shapiro, LLP (57) ABSTRACT

Regions of an integrated circuit are isolated by a structure that includes at least one isolating trench on the periphery of an active area. The trench is deep, extending at least about 0.5 μm into the substrate. The isolating structure prevents photons and electrons originating in peripheral circuitry from reaching the active area. Where the substrate has a heavily-doped lower layer and an upper layer on it, the trench can extend through the upper layer to the lower layer. A thermal oxide can be grown on the trench walls. A liner can also be deposited on the sidewalls of each trench. A fill material having a high-extinction coefficient is then deposited over the liner. The liner can also be light absorbent so that both the liner and fill material block photons.

57 Claims, 7 Drawing Sheets

U.S. PATENT DOCUMENTS

| | | | |
|---|---|---|---|
| 6,720,595 B1* | 4/2004 | Clevenger et al. | 257/292 |
| 6,767,759 B1* | 7/2004 | Rhodes | 438/60 |
| 6,888,214 B1* | 5/2005 | Mouli et al. | 257/510 |
| 6,930,336 B1* | 8/2005 | Merrill | 257/292 |
| 2001/0021559 A1* | 9/2001 | Norstrom et al. | 438/296 |
| 2001/0023949 A1* | 9/2001 | Johnson et al. | 257/222 |
| 2003/0089929 A1* | 5/2003 | Rhodes | 257/219 |
| 2003/0111687 A1* | 6/2003 | Willer et al. | 257/329 |
| 2003/0127667 A1* | 7/2003 | Inoue et al. | 257/229 |
| 2003/0168701 A1* | 9/2003 | Voldman | 257/355 |
| 2003/0209743 A1* | 11/2003 | Park | 257/290 |
| 2004/0075110 A1* | 4/2004 | Yaung et al. | 257/200 |
| 2004/0173865 A1* | 9/2004 | Scales et al. | 257/449 |
| 2004/0178430 A1* | 9/2004 | Rhodes et al. | 257/292 |
| 2004/0188727 A1* | 9/2004 | Patrick | 257/292 |
| 2004/0188739 A1* | 9/2004 | Takenaka et al. | 257/301 |
| 2004/0195592 A1* | 10/2004 | Fossum | 257/202 |
| 2004/0227061 A1* | 11/2004 | Clevenger et al. | 250/214 R |
| 2005/0017316 A1* | 1/2005 | Yaung | 257/435 |
| 2005/0045926 A1* | 3/2005 | Mouli | 257/294 |
| 2005/0061978 A1* | 3/2005 | Ilda et al. | 250/338.1 |
| 2005/0121708 A1* | 6/2005 | Hong | 257/292 |
| 2005/0133825 A1* | 6/2005 | Rhodes et al. | 257/204 |
| 2005/0176167 A1* | 8/2005 | Lee | 438/60 |
| 2005/0184353 A1* | 8/2005 | Mouli | 257/446 |

OTHER PUBLICATIONS

Nixon et al., "256 × 256 CMOS Active Pixel Sensor Camera-on-a-Chip", IEEE Journal of Solid-State Circuits, vol. 31, No. 12, Dec. 1996, pp. 2046-2050.

* cited by examiner

ISOLATION STRUCTURES FOR PREVENTING PHOTONS AND CARRIERS FROM REACHING ACTIVE AREAS AND METHODS OF FORMATION

FIELD OF THE INVENTION

The present invention relates generally to semiconductor devices, and more particularly, to trench isolation technology for isolating semiconductor devices, such as in image sensors.

BACKGROUND OF THE INVENTION

An image sensor generally includes an array of pixel cells, which include photo-conversion devices for converting light incident on the array into electrical signals, and peripheral circuitry, which includes circuitry for controlling devices of the array and circuitry for converting the electrical signals into a digital image.

In integrated circuit (IC) fabrication, it is often necessary to isolate semiconductor devices formed in the substrate. This is true for many types of ICs including, for example, DRAM, flash memory, SRAM, microprocessors, DSP and ASICs. The individual pixels of a Complementary Metal Oxide Semiconductor (CMOS) image sensor IC also need to be isolated from each other and from other devices.

A CMOS image sensor IC includes a focal plane array of pixel cells, each one of the cells including a photogate, photoconductor, or photodiode overlying a charge accumulation region within a substrate for accumulating photo-generated charge. Each pixel cell may include a transistor for transferring charge from the charge accumulation region to a floating diffusion node and a transistor, for resetting the diffusion node to a predetermined charge level prior to charge transfer. The pixel cell may also include a source follower transistor for receiving and amplifying a charge level from the diffusion node and an access transistor for controlling the readout of the cell contents from the source follower transistor.

In a CMOS image sensor, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge from the floating diffusion node. Photo charge may be amplified when it moves from the initial charge accumulation region to the floating diffusion node. The charge at the floating diffusion node is typically converted to a pixel output voltage by a source follower output transistor. The photosensitive element of a CMOS image sensor pixel is typically either a depleted p-n junction photodiode or a field induced depletion region beneath a photogate. A photon impinging on a particular pixel of a photosensitive device may diffuse to an adjacent pixel, resulting in detection of the photon by the wrong pixel, i.e. cross-talk. Therefore, CMOS image sensor pixels must be isolated from one another to avoid pixel cross talk. In the case of CMOS image sensors, which are intentionally fabricated to be sensitive to light, it is advantageous to provide both electrical and optical isolation between pixels.

CMOS image sensors of the type discussed above are generally known as discussed, for example, in Nixon et al., "256.times.256 CMOS Active Pixel Sensor Camera-on-a-Chip," IEEE Journal of Solid-State Circuits, Vol. 31(12), pp. 2046–2050 (1996); and Mendis et al., "CMOS Active Pixel Image Sensors," IEEE Transactions on Electron Devices, Vol. 41(3), pp. 452–453 (1994). See also U.S. Pat. Nos. 6,177,333 and 6,204,524, which describe operation of conventional CMOS image sensors, the contents of which are incorporated herein by reference.

Figure 1:
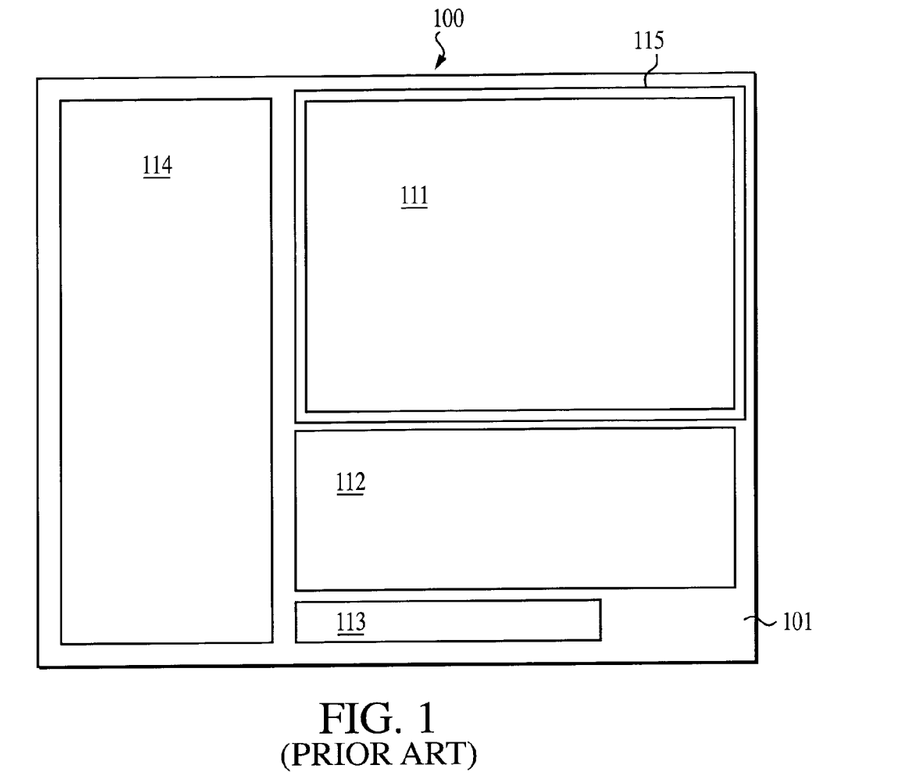
FIG. 1 is a block diagram of a conventional image sensor IC.

FIG. 1 is a block diagram of a typical CMOS image sensor IC 100 with circuitry formed at a surface of a substrate 101. Image sensor 100 includes an array of pixel cells 111. The pixel cells (not shown) are arranged in columns and rows. Each pixel cell includes a photo-conversion device. As is known in the art, a pixel cell functions by receiving photons of light and converting those photons into charge carried by, for example, electrons. In order to produce an accurate and higher quality image, a photo-conversion device of a pixel cell should receive only photons from an imaged scene. Further, a pixel cell should not receive electrons that do not result from photoconversion.

After pixel cells of array 111 generate charge in response to incident light, electrical signals indicating charge levels are read out and processed by circuitry peripheral to array 111. Peripheral circuitry of image sensor 100 typically includes row select circuitry and column select circuitry (not shown) for activating particular rows and columns of array 111. Image sensor 100 also includes analog signal processing circuitry 112, analog-to-digital conversion circuitry 113, and digital logic circuitry 114. Circuitry 112, 113, and 114 can be on a same chip 101 as array 111, as shown in FIG. 1, or on a different chip. The analog signal processing circuitry 112 samples data from array 111 and analog-to-digital conversion circuitry 113 converts the analog signals sampled by circuitry 112 into digital signals. Digital logic circuitry 114 processes the digital signals to output a digital image representative of the light incident on array 111.

During operation, the peripheral circuitry, especially analog-to-digital conversion circuitry 113, generates photons and charge carriers, e.g. electrons. Most photons generated by peripheral circuitry are in the red to near infrared region. As these photons have a long wavelength, they are able to travel far in the substrate 101. If the peripheral circuitry is on the same chip 101 as array 111, photons and electrons generated by the peripheral circuitry can travel to and interfere with pixel cells of array 111, especially those pixel cells on the edges of array 111 adjacent to the peripheral circuitry.

Figure 2:
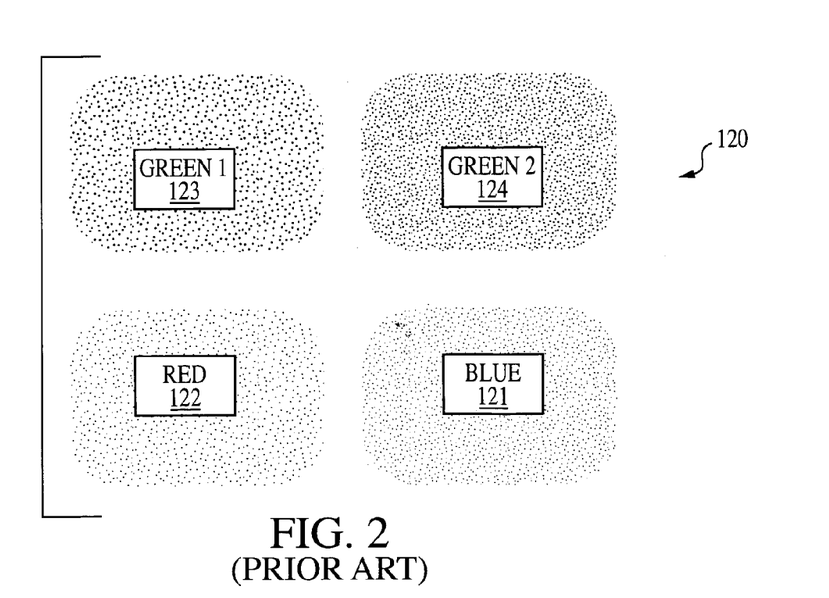
FIG. 2 is an image taken under dark conditions by an image sensor similar to that of FIG. 1.

FIG. 2 is an image 120 sensed under dark conditions by an IC similar to image sensor 100, discussed above in connection with FIG. 1. Typically, image sensor 100 includes a Bayer pattern color filter array such that image sensor 100 includes one subset of pixel cells for receiving blue light, one subset for receiving red light, and two subsets for receiving green light. Each quadrant 121, 122, 123, 124 of the image 120 shows light intensity sensed by a respective one of the four subsets of pixel cells. As shown in FIG. 2, the pixel cells near the edges of the array 111 will appear brighter than the pixel cells in the middle of array 111 because of interference by photons and electrons from the peripheral circuitry.

One method to reduce interference provides, around the array 111, a doped layer 115 (FIG. 1) in substrate 101, typically a highly doped p-type layer. Layer 115, however, still allows a majority of electrons to pass through. Additionally, at a typical width of 6 µm, few of the long wavelength (red and infrared) photons generated by the peripheral circuitry will be absorbed by layer 115.

Accordingly, it would be advantageous to have improved techniques for isolating an array of pixel cells from peripheral circuitry.

BRIEF SUMMARY OF THE INVENTION

An exemplary embodiment of the invention provides a structure for isolating a pixel array of an image sensor IC from peripheral circuitry. The structure includes a deep trench formed around at least part of the perimeter of the array. In one embodiment, the trench extends through an epitaxial layer of substrate to a P+ layer. A thermal oxide is grown inside the trench to inhibit reaction between the substrate and trench fill material. The trench may be partially or completely filled with one or more layers of a high extinction coefficient material to attenuate or absorb photons generated in the periphery. The layers may include a liner and a fill layer, for example.

In another embodiment, an isolating structure includes several parallel trenches, with or without fill material.

These and other features and advantages of the invention will be more apparent from the following detailed description that is provided in connection with the accompanying drawings that illustrate exemplary embodiments of the invention.

DETAILED DESCRIPTION OF THE INVENTION

In the following detailed description, reference is made to the accompanying drawings, which form a part hereof, and in which is shown by way of illustration of specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" refers to a picture element unit cell containing a photo-conversion device and other devices for converting electromagnetic radiation to an electrical signal or for converting electrical signals to electromagnetic radiation. The term "peripheral circuitry" refers to the circuitry of an image sensor that is peripheral to an array of pixel cells.

Embodiments of the present invention provide trench isolation techniques for isolating an array of pixel cells from peripheral circuitry. The trenches are deep, extending to a depth of at least about 0.5 micrometers ($\mu m$). In exemplary embodiments, a trench is filled with a material that inhibits or prevents photons and electrons generated by the peripheral circuitry from interfering with pixel cells of an array. As a result, interference as in FIG. 2 is reduced. Also, truer dark calibration is possible.

To better illustrate these techniques, a description of an exemplary CMOS image sensor is described below with reference to FIGS. 3–6. It should be noted, however, that the invention is not limited to CMOS image sensors and may be used in any suitable device, for example, a Charge Coupled Device (CCD) image sensor, DRAM, flash memory, SRAM, microprocessor, DSP or ASIC.

Figure 3:
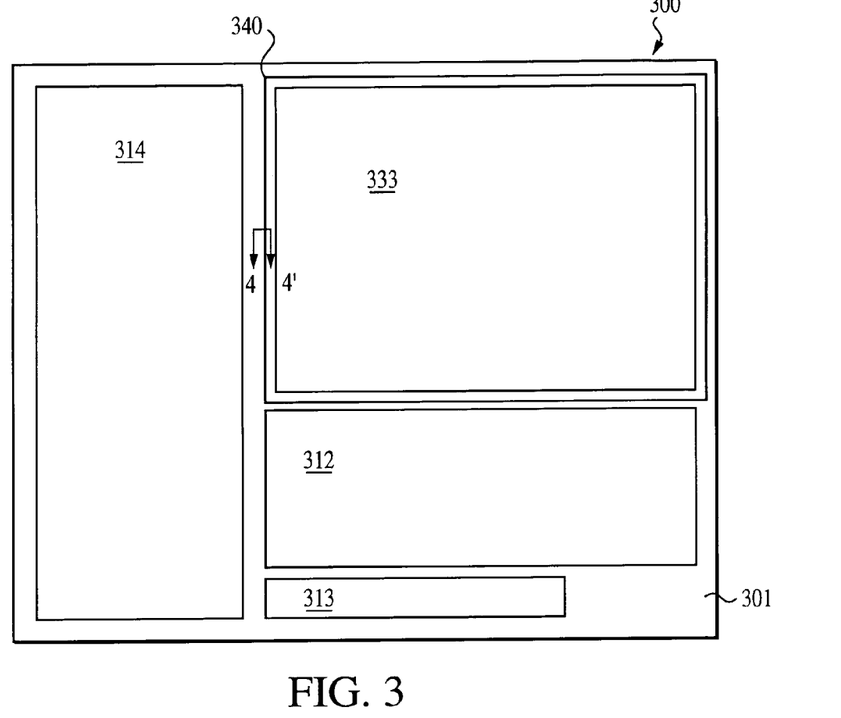
FIG. 3 is a block diagram of an image sensor IC according to an exemplary embodiment of the invention.

FIG. 3 is a block diagram of an image sensor IC 300 according to an exemplary embodiment of the invention. Image sensor 300 is formed at a surface of a substrate 301 and includes an array 333 of pixel cells which may be referred to as an active area of the substrate 301. Adjacent to the array 333 is peripheral circuitry, including row select circuitry and column select circuitry (not shown). Illustratively, the peripheral circuitry also includes analog signal processing circuitry 312, analog-to-digital conversion circuitry 313, and digital logic circuitry 314. An isolation trench 340 is also provided in substrate 301.

At least part of the trench 340 is located between the array and the peripheral circuitry. Illustratively, trench 340 extends around the perimeter of array 333. However, trench 340 may alternatively extend only around the part of the perimeter that is between the array and the peripheral circuitry. Further, trench 340 may alternatively extend only around the part of the perimeter that is between the array and that portion of the peripheral circuitry that will interfere most with the pixel cells of the array. For example, trench 340 may extend only around the part of the perimeter that is between the array and analog-to-digital conversion circuitry 313.

Figure 4:
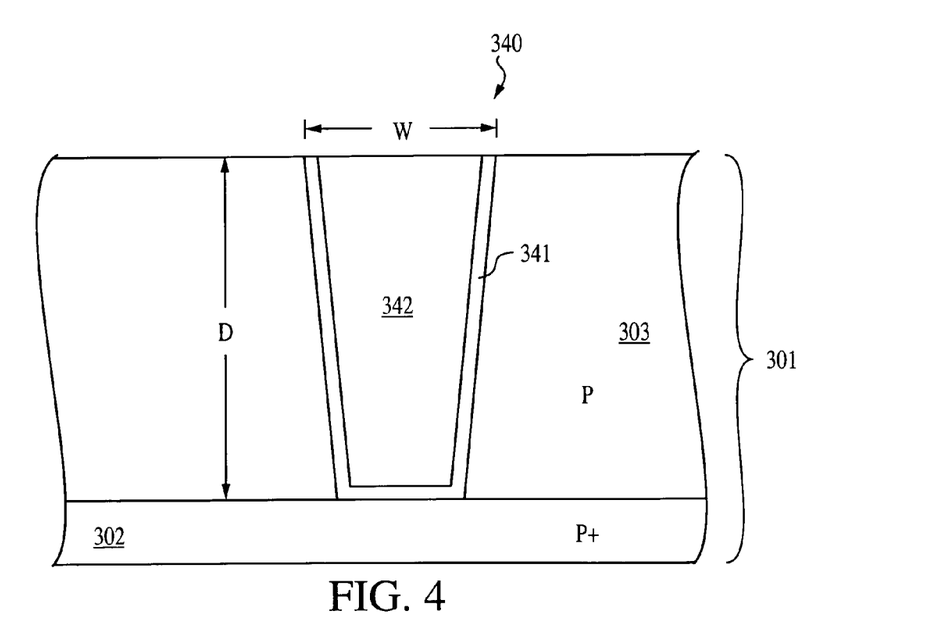
FIG. 4 is a cross sectional diagram of an exemplary embodiment of a trench isolation structure in the image sensor IC of FIG. 3 taken along line 4–4'.

FIG. 4 is a cross sectional diagram of trench 340 taken along line 4–4' shown in FIG. 3. Illustratively, substrate 301 includes an epitaxial layer 303 of a first conductivity type, e.g. p-type, which is over a base layer 302, that is heavily doped to the first conductivity type, i.e., p-type. Layers 302 and 303 can both be silicon or other suitable semiconductor material. Trench 340 has a depth, D, and D is illustratively great enough that trench 340 contacts base layer 302. Trench 340 may instead have a smaller depth and not contact base layer 302, provided that trench 340 is sufficiently deep to prevent photons or charge carriers from reaching array 333. Illustratively, trench 340 has a depth between approximately 4 micrometers (μm) to approximately 6 μm. The width W at the top of trench 340 may vary, with 6 μm being an exemplary width. Also, the width W at the top of trench 340 can be greater than the width at the bottom, so that trench 340 tapers as it extends into substrate 301.

Isolation trench 340 is filled with at least one material that serves to prevent photons and electrons generated by the peripheral circuitry from interfering with pixel cells of the array 333. As shown in FIG. 4, trench 340 is lined with material 341, a high absorption material, and filled or partially filled with material 342, which can be a high extinction coefficient material that attenuates light by absorbing photons. In addition, a thermal oxide (not shown) could be grown in trench 340 prior to deposition of material 341, providing an additional barrier to electrons. Other trench fill configurations, however, are possible and are described below in more detail.

When photons and electrons are generated by the peripheral circuitry, they can travel from the peripheral circuitry toward the array 333. Upon encountering trench 340 and the materials 341, 342 therein, at least a portion of the photons and electrons are prevented from passing through trench 340 to reach array 333.

The fabrication of the trench 340 of image sensor 300 is described below in connection with FIGS. 5A–5C. No particular order is required for any of the actions described herein, except for those logically requiring the results of prior actions. Accordingly, while the actions below are described as being performed in a general order, the order is exemplary only and may be altered.

Illustratively, trench 340 is formed prior to the formation of devices of the array and peripheral circuitry. As shown in FIG. 5A, a trench 340 is formed in epitaxial layer 303, which is above base layer 302. Trench 340 is formed having a depth such that trench 340 contacts base layer 302. Trench 340 can be formed by techniques known in the art, such as an anisotropic etch through a mask (not shown) photolithographically formed on substrate 301 and having openings where trench 340 is to be formed.

Figure 5A:
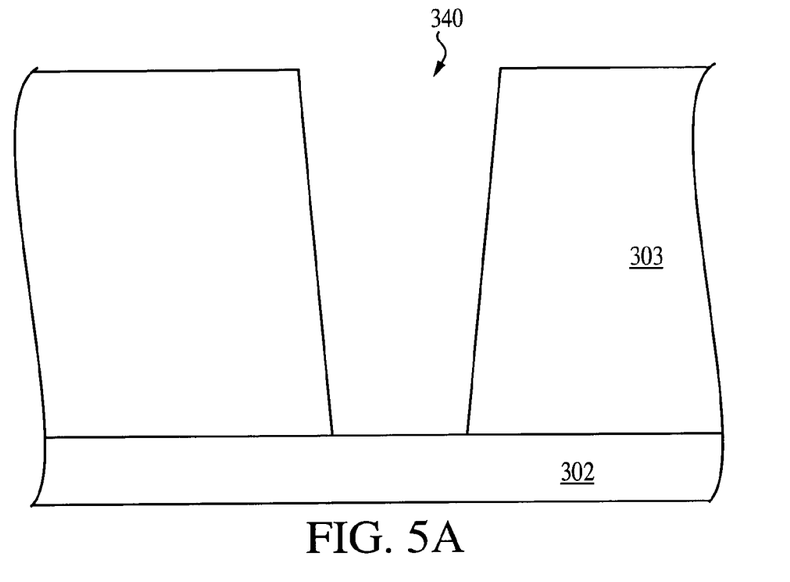
FIG. 5A is a cross sectional diagram of the structure of FIG. 4, illustrating an initial stage of fabrication.
Figure 5B:
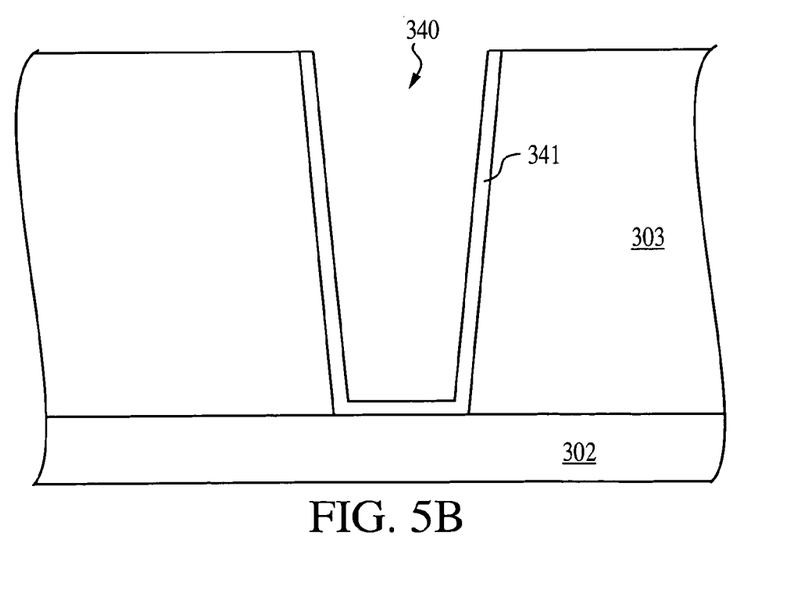
FIG. 5B is a cross sectional diagram of the structure of FIG. 4, illustrating an intermediate stage of fabrication.

Referring to FIG. 5B, an optional liner 341 is formed on the sidewalls and bottom of trench 340. Illustratively, liner 341 is formed of, for example, a thin layer of high absorption material that could be deposited through the same mask used to form trench 340. Exemplary high absorption materials include nitrides and amorphous carbons, such as B-doped carbon. In an exemplary embodiment, a thin layer of thermal oxide may be grown inside the trench 340, prior to the deposition of liner 341, to prevent reaction between the substrate silicon and the trench fill material. The thermal oxide material also acts as a physical barrier for carriers; an electron would require 3.2 eV to cross through the thermal oxide. Accordingly, the thermal oxide would help to isolate the array from peripheral noise. Since the trench is etched through to the P+ layer 302, electrons crossing under the thermal oxide would have a tendency to quickly recombine; if layer 302 has a B concentration of ~2E18, for example, the electron diffusion length would be only 1.1 μm.

Figure 5C:
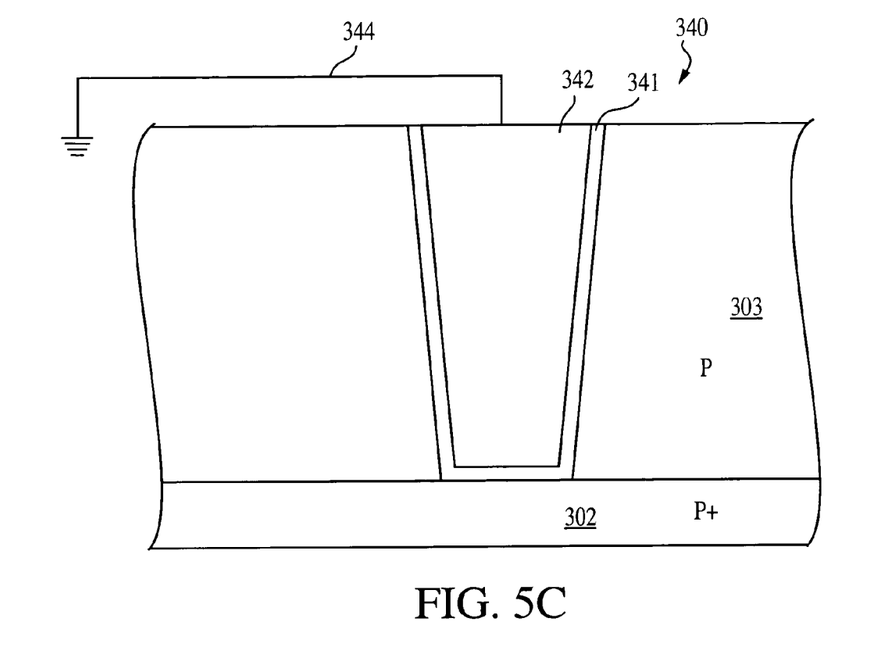
FIG. 5C is a cross sectional diagram of the structure of FIG. 4, illustrating an intermediate stage of fabrication.

As illustrated in FIG. 5C, trench 340 is then filled with material 342. Illustratively, material 342 is a light attenuating material that prevents at least a portion of photons from the peripheral circuitry from entering the array 333 and also a material that prevents electrons from entering array 333.

Material 342 can be, for example, doped or undoped polysilicon or amorphous boron-doped carbon. If a high absorption material is used for optional liner 341, the trench 340 could instead be filled with oxide or some other material that is easily planarized. Alternatively, the trench 340 could just include a thermal oxide and high absorption material 342 without liner 341. A high extinction coefficient fill material attenuates or blocks photons generated in the periphery preventing them from being absorbed by photodiodes in the array. The fill material 342 could also be tied to ground through a connection 344 to prevent charge buildup.

For example, Table 1 below illustrates the percentage of light that is blocked when a thin film (of about 1000 Angstroms) of amorphous B-doped carbon is used as a liner compared to the percentage of light that is amorphous B-doped carbon is a used to completely fill the trench of about 6000 Angstroms).

TABLE 1

| Wavelength k | Attenuation (1000 A Film) | Attenuation (6000 A Film) |
|---|---|---|
| 3500 | 0.5232 | 15.30% | 0.00% |
| 4000 | 0.4922 | 21.32% | 0.01% |
| 4500 | 0.4714 | 26.83% | 0.04% |
| 5000 | 0.4587 | 31.59% | 0.10% |
| 5500 | 0.4516 | 35.65% | 0.21% |
| 6000 | 0.4476 | 39.18% | 0.36% |
| 6500 | 0.4444 | 42.37% | 0.58% |
| 7000 | 0.4404 | 45.38% | 0.87% |
| 7500 | 0.4338 | 48.36% | 1.28% |
| 8000 | 0.4262 | 51.22% | 1.80% |
| 8854.55017 | 0.4107 | 55.85% | 3.03% |
| 9018.17993 | 0.4073 | 56.71% | 3.33% |
| 9509.08997 | 0.3968 | 59.21% | 4.31% |
| 10000 | 0.3861 | 61.57% | 5.45% |

Figure 6:
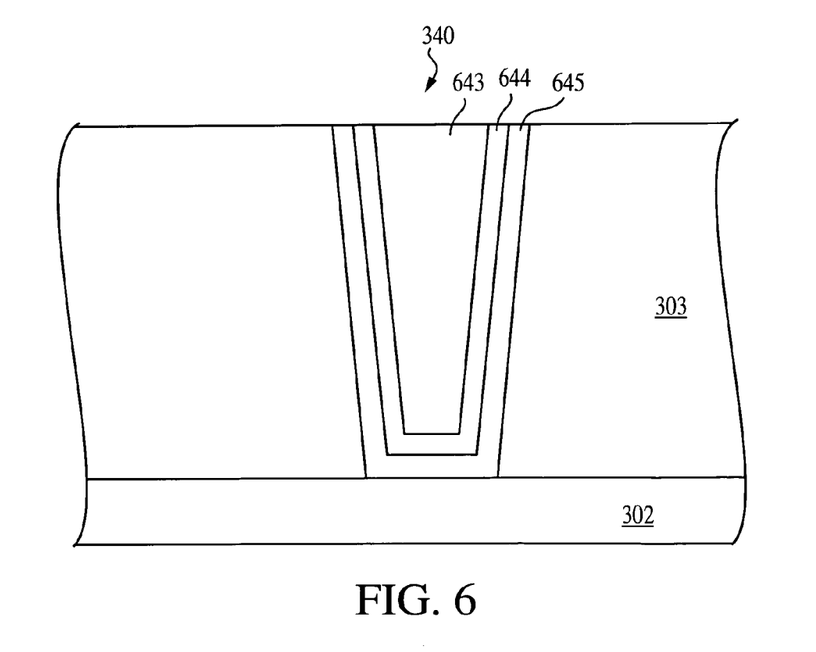
FIG. 6 is a cross sectional diagram of another exemplary embodiment of a trench isolation structure in the image sensor IC of FIG. 3, taken along line 4–4'.

Trench 340 can also be filled with more than two materials. For example, FIG. 6 depicts trench 340 containing three materials 643, 644, and 645. Materials 643, 644, and 645 have different refractive indices. Based on the refractive indices of materials 643, 644, and 645, the layering structure of materials 643, 644, and 645 is configured such that photons entering the trench from peripheral circuitry (FIG. 3) will be reflected away from array 333. Illustratively, material 643 has a greater refractive index than material 644, which in turn has a greater refractive index than material 645.

Conventional processing methods may be used to complete the image sensor IC 300. For example, devices of the array 333 and of the peripheral circuitry can be formed. Insulating, shielding, and metallization layers can then be formed and gate lines and other connections to the array 333 may be formed. Conventional layers of conductors and insulators may also be used to interconnect the structures and to connect pixel cells of array 300 to peripheral circuitry.

Figure 7:
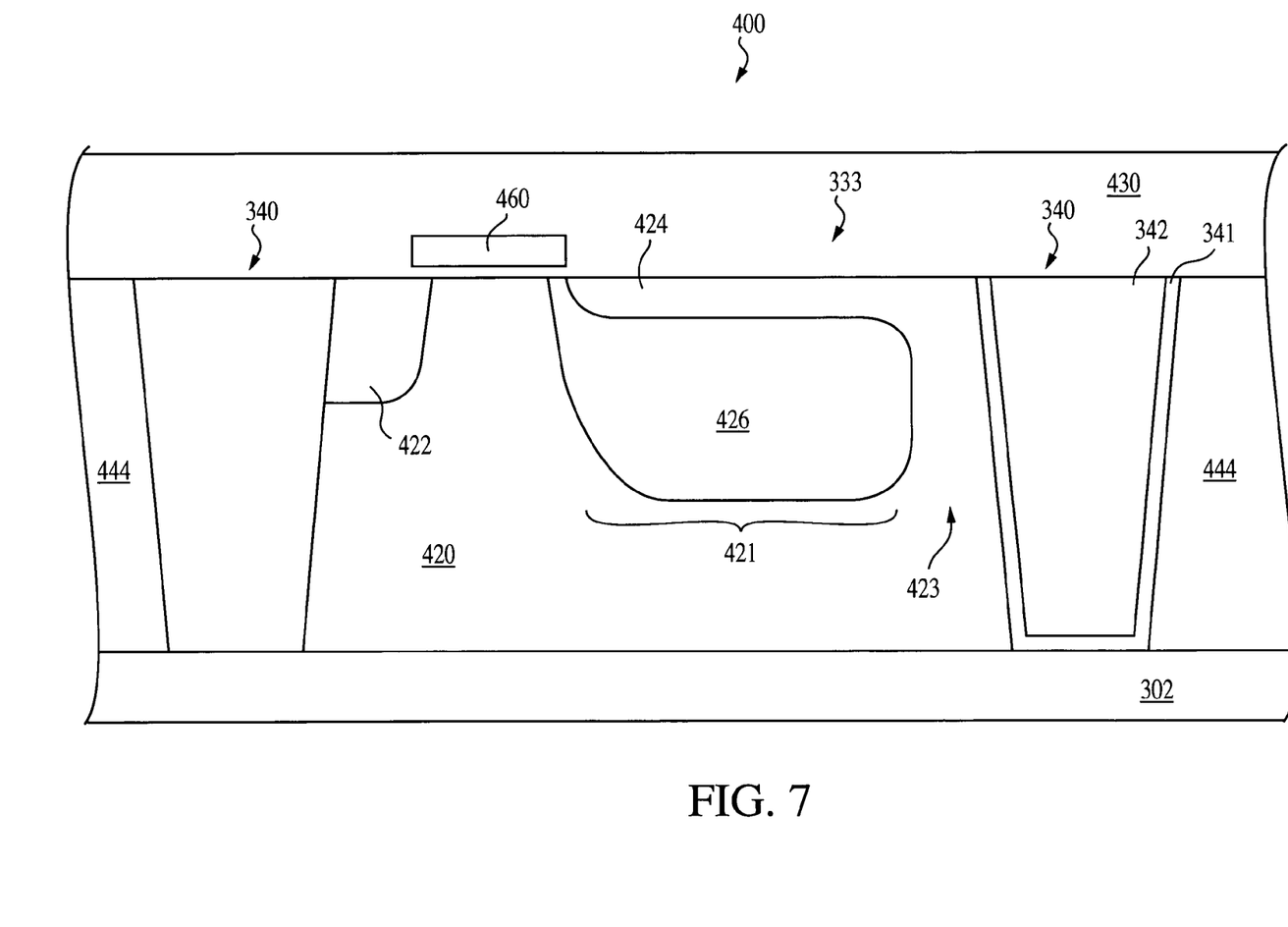
FIG. 7 illustrates a side sectional view of a CMOS image sensor portion incorporating the trench of FIG. 4.

An exemplary CMOS image sensor in accordance with the invention and having a pinned photodiode 421 as part of array 333 (FIG. 3) is shown in FIG. 7. The pinned photodiode 421 has a p-type surface layer 424 and an n-type photodiode region 426 within a p-type active layer 420. A junction is formed around the entirety of the n-type region 426. An impurity doped floating diffusion region 422, preferably having n-type conductivity, is provided on one side of the channel region of transfer gate 460, the other side of which has a portion of n-type region 426. A trench isolation region 340 is formed adjacent to but spaced from n-type region 421, to isolate the structures formed in the active layer 420 from peripheral circuitry 444. An electrical connection region 423 for providing hole accumulation is formed adjacent the sidewalls of the trench isolation region 340. The trench isolation region 340 is formed as described above with respect to FIGS. 4–6.

The gate stacks, for example transfer gate 460, may be formed before or after the trench is etched. The order of these preliminary process steps may be varied as is required or convenient for a particular process flow, for example, if a photogate sensor which overlaps the transfer gate is desired, the gate stacks must be formed before the photogate, but if a non-overlapping photogate is desired, the gate stacks may be formed after photogate formation.

A translucent or transparent insulating layer 430 is formed over the CMOS image sensor 400. Conventional processing methods are then carried out to form for example, contacts (not shown) in the insulating layer 430 to provide an electrical connection to the source/drain regions, the floating diffusion region 422, and other wiring to connect gate lines and other connections in the sensor 400. For example, the entire surface may then be covered with a passivation layer, of e.g., silicon dioxide, BSG, PSG, or BPSG, which is CMP planarized and etched to provide contact holes, which are then metallized to provide contacts to the photogate (if used), reset gate, and transfer gate.

An integrated circuit with a pixel array and an isolation trench as described with reference to FIGS. 4–6, may be further processed using techniques known in the art or other suitable techniques to arrive at a CMOS image sensor IC.

Figure 8:
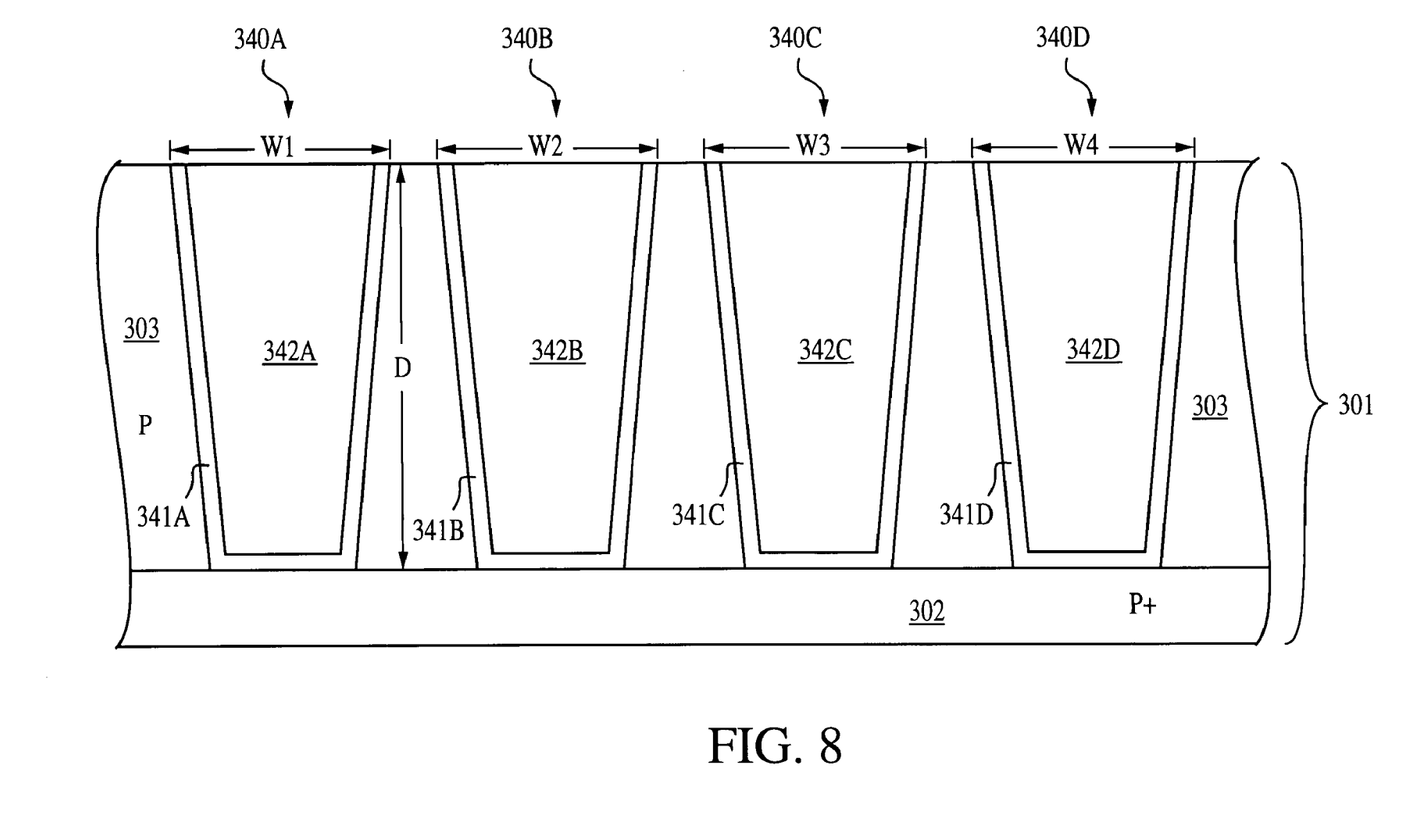
FIG. 8 is a cross-sectional diagram of another exemplary embodiment of a trench isolation structure.

Under an alternate embodiment, multiple, substantially parallel trenches may be used in place of the single trench configuration shown in FIGS. 4–6. This embodiment improves blocking of red and infrared photons. FIG. 8 illustrates a cross-sectional diagram of a 4-trench configuration. Substrate 301 includes an epitaxial layer 303 of a first conductivity type, e.g. p-type, which is over a base layer 302, which is heavily doped to the first conductivity type. Trenches 340A–D all have a depth D such that each trench contacts base layer 302. Trenches 340A–D may instead have smaller depths and not all contact layer 302, provided that trenches 340A–D are sufficiently deep to prevent photons or charge carriers from reaching array 333. Illustratively, trenches 340A–D have a depth between approximately 4 micrometers (μm) and approximately 6 μm. The widths W1–W4 of trenches 340A–D are each approximately 1 μm, with 500 nm of crystal silicon between adjacent trenches. It should be understood that, while a 4-trench configuration is illustrated, any number of trenches may be utilized to achieve the desired effect.

In addition to a thermal oxide as described above, isolation trenches 340A–D contain at least one material that serves to prevent photons generated by the peripheral circuitry from interfering with pixel cells of the array 333. As shown in the exemplary embodiment at FIG. 8, each trench 340A–D is respectively lined with a material 341A–D, a high absorption, light attenuating film, such as nitride or amorphous carbon. By lining the trenches with the film, the use of filler material becomes optional. Alternately, each trench 340A–D may nevertheless be respectively filled, or partially filled, with material 342A–D, which is also a high extinction coefficient material. Other trench fill configurations, however, are possible. In one embodiment, filler material 342A–D is omitted during fabrication. Also, in a multiple trench configuration, the liner material 341A–D may be omitted if the unlined trenches provide adequate protection from electrons and photons emitted by peripheral circuitry.

Table 2 below compares the amount of red and infrared light that passes through a single large trench compared to multiple smaller trenches (in the examples below, through 4 smaller trenches). Each trench set up uses a total of about 6 μm of space, and is about 4 μm deep. The smaller trenches are about 1 μm wide with about 500 nm of crystal silicon between them.

TABLE 2

| E | Wavelength (nm) | Single Trench with 1000 Å alpha carbon liner | 4 Trenches with no liner | 4 Trenches with 100 Å nitride liner | 4 Trenches with 100 Å a-carbon liner |
|---|---|---|---|---|---|
| 1.1 | 1227.27 | 41.18% | 9.84% | 6.52% | 2.88% |
| 1.2 | 1125.00 | 40.66% | 9.53% | 6.33% | 2.73% |
| 1.3 | 1038.46 | 40.01% | 9.14% | 6.07% | 2.56% |
| 1.4 | 964.29 | 39.32% | 8.72% | 5.80% | 2.39% |
| 1.5 | 900.00 | 38.60% | 8.31% | 5.51% | 2.22% |
| 1.6 | 843.75 | 37.88% | 7.85% | 5.16% | 2.06% |
| 1.7 | 794.12 | 37.02% | 7.38% | 4.84% | 1.88% |
| 1.8 | 750.00 | 36.76% | 7.15% | 4.75% | 1.83% |
| 1.9 | 710.53 | 35.87% | 6.63% | 4.39% | 1.65% |
| 2 | 675.00 | 34.94% | 6.08% | 4.02% | 1.49% |

When photons and electrons are generated by the peripheral circuitry, they can travel from the peripheral circuitry toward the array 333. Each interface they encounter results in some reflection, especially for photons, and absorption, especially for electrons. By using multiple trenches, the number of interfaces is increased, and light reflection and electron absorption is also increased. When liners are used, each additional trench will add two additional layers of liner for photons and electrons to pass through, causing further absorption and reflection.

Figure 9:
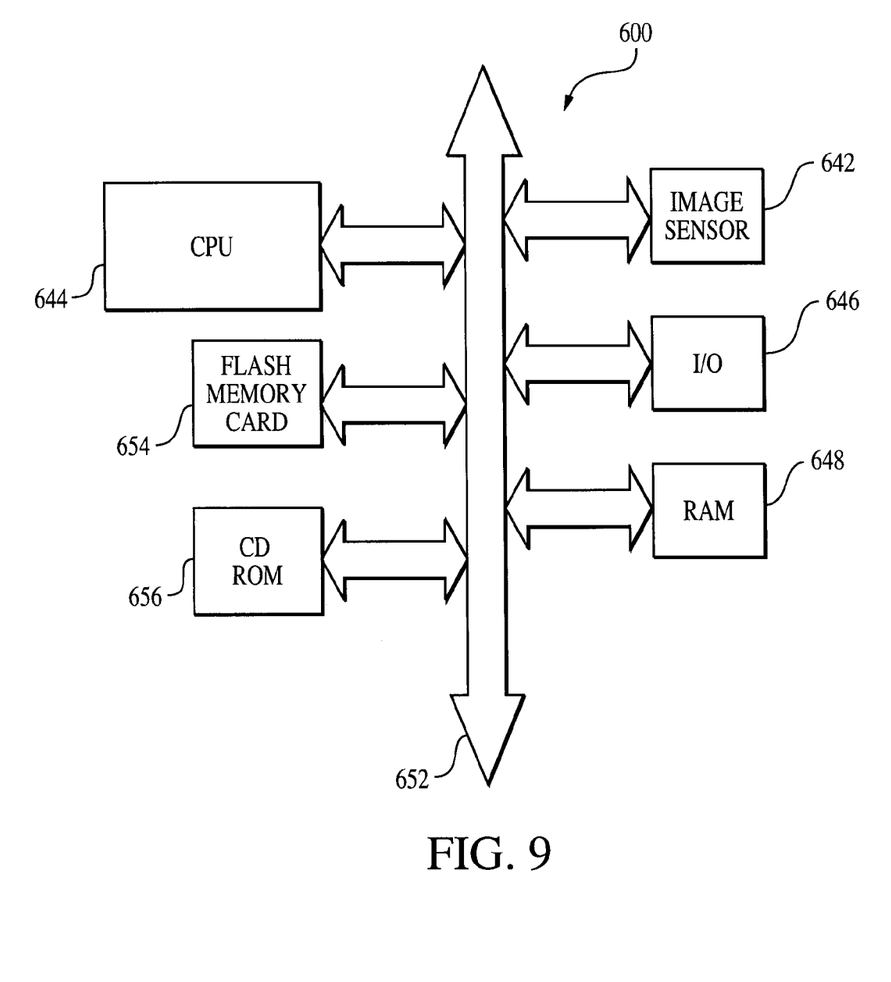
FIG. 9 is a schematic diagram of a processor system incorporating an image sensor IC with a trench isolation structure in accordance with any of the exemplary embodiments of the invention.

FIG. 9 is a block diagram of a processor based system 600, which includes an image sensor 642. Processor based system 600 is exemplary of a system having digital circuits, which could include an image sensor. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

Processor based system 600, such as a computer system, for example generally comprises a central processing unit (CPU) 644, for example, a microprocessor, which communicates with an input/output (I/O) device 646 over a bus 652. The image sensor 642 which includes an IC with a single or multiple isolation trench configuration as in FIGS. 3–6 or 8, also communicates with CPU 644 the system over bus 652. The computer system 600 also includes random access memory (RAM) 648, and, in the case of a computer system may include peripheral devices such as a flash memory card 654, or a compact disk (CD) ROM drive 656 which also communicate with CPU 644 over the bus 652. It may also be desirable to integrate the processor 644, image sensor 642 and memory 648 on a single IC chip.

Although the above embodiments have been described above with reference to the formation of trenches formed around at least a part of the perimeter of the array and having a particular shape, it must be understood that the invention is not limited to the formation of trenches. Accordingly, the present invention has applicability to other isolation structures having various shapes and geometries, in accordance with design specifications and as desired. Thus, for example, the trenches need not have the trapezoidal cross-section shown above in FIGS. 4–8, and the trenches may have a rectangular or triangular cross-section or other desired cross-section. In addition, the isolation structures need not be trenches, as they may include any structure that is formed around at least a part of the perimeter of the array and that isolates the array from the periphery.

The above description and drawings are only to be considered illustrative of exemplary embodiments, that achieve the features and advantages of the invention. Modification and substitutions to specific process conditions and structures can be made without departing from the spirit and scope of the invention. While the above embodiments are described in connection with CMOS and CCD image sensor ICs, the invention is not limited to these embodiments. Accordingly, the invention is not to be considered as being limited by the foregoing description and drawings, but is only limited by the scope of the appended claims.

What is claimed as new and desired to be protected by Letters Patent of the United States is:

1. An integrated circuit comprising:
    a substrate comprising a lower layer and an upper layer on the lower layer;
    an array of pixel cells at a surface of the upper layer, each pixel cell comprising a photo-conversion device; and
    a trench structure around at least a portion of the array, wherein the trench structure extends from the surface to the lower layer, and wherein the trench structure prevents at least a portion of photons or charged particles from passing through the trench structure to the array wherein said trench structure has a top width and a base layer width and the base layer width is smaller than the top width wherein the trench structure has sidewalls and contains a first material that prevents at least a portion of photons or charged particles from passing through the trench structure to the array.

2. The integrated circuit of claim 1, further comprising a thermal oxide on the sidewalls of the trench structure.

3. The integrated circuit of claim 1, wherein the first material is selected from the group consisting of doped polysilicon, undoped polysilicon and boron-doped carbon.

4. The integrated circuit of claim 1, wherein the trench structure has a depth of about 4 µm to about 6 µm.

5. The integrated circuit of claim 1, wherein the integrated circuit comprises one of a CMOS image sensor and a CCD image sensor.

6. The integrated circuit of claim 1, further comprising a liner formed along at least a portion of the sidewalls.

7. The integrated circuit of claim 6, wherein the liner is a high absorption material.

8. The integrated circuit of claim 1, further comprising a second material that partially fills the trench structure, wherein the second material prevents at least a portion of photons or charged particles from passing through the trench structure to the array.

9. The integrated circuit of claim 8, wherein the second material has a higher refractive index than that of the first material.

10. The integrated circuit of claim 8, further comprising a third material that partially fills the trench structure, wherein the third material prevents at least a portion of photons or charged particles from passing through the trench structure to the array.

11. The integrated circuit of claim 10, wherein the third material has a higher refractive index than that of the second material.

12. A structure for isolating an active area of an integrated circuit, the structure comprising:
    a trench formed in a substrate of the integrated circuit along at least a portion of a periphery of the active area, the substrate having a lower layer and an upper layer on the lower layer, wherein the trench extends from a surface of the upper layer to a surface of the lower layer and the trench includes a top width and a base layer width where the base layer width is smaller than the top width;
    an insulating liner formed along sidewalls of the trench; and
    a first fill material formed over the insulating liner wherein the first fill material at least partially fills the trench and prevents at least a portion of photons and electrons from passing through the trench to the active area.

13. The structure of claim 12, wherein the insulating liner is a high absorption material.

14. The structure of claim 12, further comprising a thermal oxide material on the sidewalls of the trench.

15. The structure of claim 12, wherein the trench has a depth of about 4 µm to about 6 µm.

16. The structure of claim 12, wherein the semiconductor device comprises one of a CMOS image sensor, a CCD image sensor, a DRAM, a flash memory, an SRAM, a microprocessor, a DSP and an ASIC.

17. The structure of claim 12, wherein the first fill material is an attenuating material that absorbs photons.

18. The structure of claim 17, wherein the first fill material comprises one of doped polysilicon, undoped polysilicon and boron-doped carbon.

19. The structure of claim 12, further comprising a second fill material that partially fills the trench, wherein the second material prevents at least a portion of photons from passing through the trench.

20. The structure of claim 19, wherein the second fill material has a higher refractive index than that of the first material and is deposited over the surface of the first fill material.

21. The structure of claim 19, further comprising a third fill material that partially fills the trench, wherein the third fill material prevents at least a portion of photons from passing through the trench.

22. The structure of claim 21, wherein the third fill material has a higher refractive index than that of the second material and is deposited over the surface of the second fill material.

23. A structure for isolating an active area on an integrated circuit, the structure comprising:
    a plurality of trenches formed in a substrate of the integrated circuit on at least a portion of a periphery of the active area, wherein a depth of each of the plurality of trenches extends to a surface of a base layer of said substrate and where at least one trench of the plurality of trenches includes a top width and a base layer width where the base layer width is smaller than the top width further comprising an insulating liner formed along each sidewall of the plurality of trenches wherein the insulating liner comprises a high absorption material.

24. The structure according to claim 23, wherein the insulating liner comprises a light attenuation film.

25. The structure according to claim 23, wherein the insulating liner comprises a nitride material or alpha carbon material.

26. The structure according to claim 23, wherein each of the trenches has a depth of about 4 µm to about 6 µm.

27. The processing system of claim 26, further comprising a second fill material that has a higher refractive index than that of the first material.

28. The structure according to claim 23, further comprising a first fill material that at least partially fills each of the plurality of trenches and prevents at least a portion of photons or charged particles from passing through the trench.

29. The structure according to claim 28, wherein the first fill material is a high absorption material.

30. The structure according to claim 28, wherein the first fill material is a high extinction coefficient material.

31. The structure according to claim 28, wherein the first fill material is one of doped polysilicon, undoped polysilicon and boron-doped carbon.

32. The structure according to claim 28, further comprising a second fill material that partially fills each of the plurality of trenches, wherein the second material prevents at least a portion of photons from passing through the trench.

33. The structure according to claim 32, wherein the second fill material has a higher refractive index than that of the first material.

34. The structure according to claim 32, further comprising a third fill material that partially fills each of the plurality of trenches, wherein the third fill material prevents at least a portion of photons from passing through the trench.

35. The structure according to claim 34, wherein the third fill material has a higher refractive index than that of the second material.

36. A processing system, the processing system comprising:
a processor;
an integrated circuit coupled to the processor, the integrated circuit comprising a structure for isolating an active area on the integrated circuit, the structure comprising:
a trench formed in a substrate on at least a portion of a periphery of the active area of the integrated circuit, wherein the trench extends to a surface of a base layer below the substrate, and wherein the trench has sidewalls and the trench includes a top width and a base layer width where the base layer width is smaller than the top width;
an insulating liner formed along the sidewalls; and
a first fill material formed over the insulating liner that at least partially fills the trench and prevents at least a portion of photons or electrons from passing through the trench.

37. The processing system of claim 36, wherein the insulating liner is a high absorption material or a thermal oxide material.

38. The processing system of claim 36, wherein the first fill material is selected from the group consisting of doped polysilicon, undoped polysilicon and boron-doped carbon.

39. The processing system of claim 36, wherein the trench has a depth of about 4 µm to about 6 µm.

40. The processing system of claim 36, wherein the integrated circuit comprises one of a CMOS image sensor, a CCD image sensor, a DRAM, a flash memory, an SRAM, a microprocessor, a DSP and an ASIC.

41. An isolation structure provided at a surface of a substrate between a source area in which at least one of photons and charged particles originate and an active region, the isolation structure comprising:
at least one trench extending from the surface of the substrate into the substrate to a depth of at least about 0.5 µm and with a length extending across the surface of the substrate between the source area and the active area and the at least one trench includes a top width and a base layer width where the base layer width is smaller than the top width.

42. An integrated circuit comprising:
a substrate;
an array of pixel cells at a surface of the substrate, each pixel cell comprising a photo-conversion device; and
at least one trench around at least a portion of the array, wherein the trench extends from the surface of the substrate to a depth of at least about 0.5 µm into the substrate and the at least one trench includes a top width and a base layer width where the base layer width is smaller than the top width wherein the at least one trench structure has sidewalls and contains a first material that prevents a portion of photons or charged particles from passing through the trench structure to the array.

43. A processing system, the processing system comprising:
a processor;
an integrated circuit coupled to the processor, the integrated circuit comprising a structure for isolating an active area on the integrated circuit, the structure comprising:
a trench extending from a surface of a substrate to a depth of at least about 0.5 µm into the substrate and the trench includes a top width and a base layer width where the base layer width is smaller than the top width.

44. An integrated circuit comprising:
a substrate comprising a lower layer and an upper layer on the lower layer;
an array of pixel cells at a surface of the upper layer, each pixel cell comprising a photo-conversion device; and
a trench structure around at least a portion of the array, wherein the trench structure:
extends from the surface to the lower layer,
prevents at least a portion of photons or charged particles from passing through the trench structure to the array;
has sidewalls and contains a first material that prevents at least a portion of photons or charged particles from passing through the trench structure to the array; and
contains a second material that partially fills the trench structure, wherein the second material prevents at least a portion of photons or charged particles from passing through the trench structure to the array.

45. The integrated circuit of claim 44, wherein the second material has a higher refractive index than that of the first material.

46. The integrated circuit of claim 44, further comprising a third material that partially fills the trench structure, wherein the third material prevents at least a portion of photons or charged particles from passing through the trench structure to the array.

47. The integrated circuit of claim 46, wherein the third material has a higher refractive index than that of the second material.

48. A structure for isolating an active area of an integrated circuit, the structure comprising:
a trench formed in a substrate of the integrated circuit along at least a portion of a periphery of the active area, the substrate having a lower layer and an upper layer on the lower layer, wherein the trench extends from a surface of the upper layer to a surface of the lower layer;

an insulating liner formed along sidewalls of the trench;

a first fill material formed over the insulating liner wherein the first fill material at least partially fills the trench and prevents at least a portion of photons and electrons from passing through the trench to the active area, and a second fill material that partially fills the trench, wherein the second material prevents at least a portion of photons from passing through the trench.

49. The structure of claim 48, wherein the second fill material has a higher refractive index than that of the first material and is deposited over the surface of the first fill material.

50. The structure of claim 48, further comprising a third fill material that partially fills the trench, wherein the third fill material prevents at least a portion of photons from passing through the trench.

51. The structure of claim 50, wherein the third fill material has a higher refractive index than that of the second material and is deposited over the surface of the second fill material.

52. A structure for isolating an active area on an integrated circuit, the structure comprising:

a plurality of trenches formed in a substrate of the integrated circuit on at least a portion of a periphery of the active area, wherein a depth of each of the plurality of trenches extends to a surface of a base layer of said substrate and the plurality of trenches include a first fill material that at least partially fills each of the plurality of trenches and prevents at least a portion of photons or charged particles from passing through the trench wherein the first fill material is a high extinction coefficient material.

53. A structure for isolating an active area on an integrated circuit, the structure comprising:

a plurality of trenches formed in a substrate of the integrated circuit on at least a portion of a periphery of the active area, wherein a depth of each of the plurality of trenches extends to a surface of a base layer of said substrate and the plurality of trenches include:

a first fill material that at least partially fills each of the plurality of trenches and prevents at least a portion of photons or charged particles from passing through the trench; and a second fill material that partially fills each of the plurality of trenches, wherein the second material prevents at least a portion of photons from passing through the trench.

54. The structure according to claim 53, wherein the second fill material has a higher refractive index than that of the first material.

55. The processing system of claim 53 wherein said second fill material has a higher refractive index than that of the first material.

56. The structure according to claim 53, further comprising a third fill material that partially fills each of the plurality of trenches, wherein the third fill material prevents at least a portion of photons from passing through the trench.

57. The structure according to claim 56, wherein the third fill material has a higher refractive index than that of the second material.

* * * * *

UNITED STATES PATENT AND TRADEMARK OFFICE
CERTIFICATE OF CORRECTION

| | | |
|---|---|---|
| PATENT NO. | : 7,154,136 B2 | Page 1 of 1 |
| APPLICATION NO. | : 10/781707 | |
| DATED | : December 26, 2006 | |
| INVENTOR(S) | : Bryan G. Cole et al. | |

It is certified that error appears in the above-identified patent and that said Letters Patent is hereby corrected as shown below:

In the Specification, the following error is corrected:

Column 6, line 17, "about 6000 Angstroms)." should read --(to a thickness of about 6000 Angstroms).--.

Signed and Sealed this

Third Day of April, 2007

JON W. DUDAS
*Director of the United States Patent and Trademark Office*